Aug. 22, 1961 M. H. MURRAY ET AL 2,997,391
PHOTOSENSITIVE POLYAMIDE RESINS CONTAINING STILBENE UNITS IN THE MOLECULE
Filed April 22, 1957
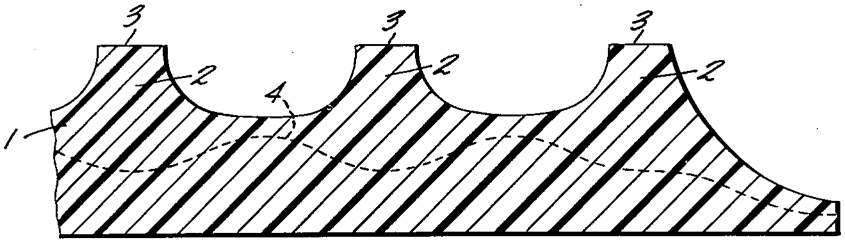
INVENTORS.
MARGARET H. MURRAY &
ROBERT M. LEEKLEY
BY
Brumbaugh, Free, Graves & Donohue
their ATTORNEYS United States Patent Office 2,997,391

Patented Aug. 22, 1961

2,997,391

PHOTOSENSITIVE POLYAMIDE RESINS CONTAINING STILBENE UNITS IN THE MOLECULE

Margaret H. Murray, Springdale, and Robert M. Leekley, Westport, Conn., assignors to Time, Incorporated, New York, N.Y., a corporation of New York Filed Apr. 22, 1957, Ser. No. 654,120

7 Claims. (Cl. 96—35)

This invention relates to photosensitive synthetic polyamides, and, more particularly, to polyamide resins which contain stilbene units in the polyamide molecule, and which are useful in the manufacture of printing plates.

The plates used in nonplanographic reproduction processes are for the most part made of metal, and are prepared by photoengraving. The metal is usually of zinc or magnesium alloy, and the plates are coated with a photosensitive resist composition which initially is soluble in certain developer solutions but which after exposure to light, becomes insoluble in such developer solutions. If, therefore, such a coated plate is exposed to light through a photomechanical negative or positive, the areas beneath the opaque areas of the negative or positive through which light does not pass remain soluble in the developer, while the areas beneath the open areas of the negative or positive through which the light did pass are rendered insoluble in such solutions. When the plate is contacted with the developer, the soluble areas are dissolved out, and the naked metal base of the plate is exposed in those areas, while the rest of the plate remains coated. These bare areas therefore correspond with the outlines of the image.

Next, the bare surface of the metal is etched out in the exposed areas, so as to form the image in relief. Nitric acid is generally used for etching zinc and magnesium alloy plates. Other acids may be used for plates made of other types of metals.

In the drawing there is shown in the cross-section of what might be called the ideal half-tone relief printing plate. The base 1 of each individual printing element 2 is broad as compared to its top 3, so that the image is strong and the individual printing elements are not easily distorted or tilted. The sides of each element are sufficiently steep near the top printing surface so that the dot area does not increase rapidly with the plate wear or with increased printing pressure. There is adequate depth, and there is no undercutting.

As the drawing shows, it is essential that the edges of the elements be sharp and well-defined if the final plate is to print the image cleanly. However, metal plates of the type in the drawing are not obtainable by simple etching, due to undercutting. The etching process is difficult to control, because it proceeds wherever bare metal lies exposed to the acid. Thus, as the etching process continues, the etching solution etches not only deeper into the plate but also deeper into the edges of the image. Such sidewise etching is called "lateral attack," and results in undercutting of the image, or in widening of the etch at the top, or both.

In order to avoid undercutting, the etching is carried out in a series of "bites." In the first etch, after a slight relief has been built up, the plate is removed from the etching solution, washed and dried, and a resin or wax, or both, then applied to the edges of the relief image. The resin or wax is melted or banked into the lateral areas by holding the plate over a hot flame. The plate, when immersed a second time in the etching bath, now will be protected from undercutting to a certain extent by the coating of the resin. As the etch deepens, more bare areas subject to undercutting are exposed, so that the protective coating loses its value and a new coating is needed, so that a new bank-in or burn-in follows. An etch of the normal depth may require four to seven etchings and bank-ins of this type.

This procedure has many disadvantages. Besides requiring much hand work in applying the resin so as not to coat the areas of the plate which must be etched still deeper, it is impossible to obtain a smooth contour of the lateral edges of the image relief. The general effect of the successive bites is to form a series of stepped shoulders on the relief, upon which shoulders the ink can accumulate during use, and give the effect of a plate which is only as deep as the first shoulder.

In accordance with the instant invention, compositions are provided which make it possible to obtain half-tone plates having the appearance in cross-section shown in the drawing.

This result is obtained by formulating a composition which is so composed that a substantial portion of the light which is passed into the composition is scattered, but in such a way that even the scattered light proceeds in substantially the direction at which the light enters the plate. The effect of this directed scattering is to increase the shoulder support for the relief with increasing depth, as shown in the drawing.

In the invention there is employed a photosensitive polyamide resin in which the light-sensitive portion is incorporated directly in the polyamide molecule. This resin is strongly absorptive of light and, therefore, the small amount of light which is scattered at greater than the angle desired to increase shoulder size is rendered ineffective by the light-sensitive polyamide resin.

The photosensitive compositions of the invention are based upon light-sensitive polyamide resins in which the light-sensitive units are stilbene units

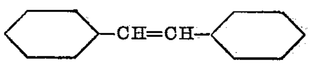

linked to the polyamide molecule by the carbonyl carbon of the carboxylic group forming amide units of the chain, or by the amino nitrogen of a methylene amino group, viz.:

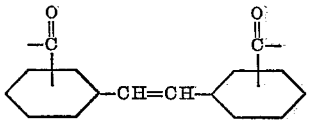

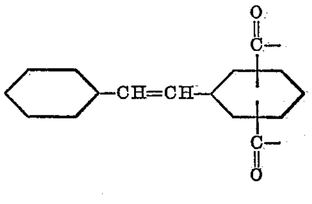

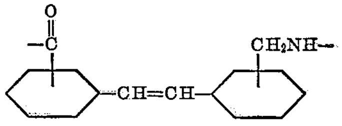

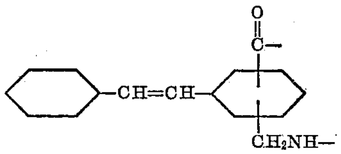

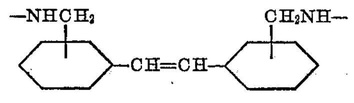

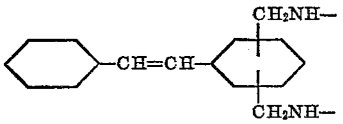

When both linking units are in the same ring, they preferably are not ortho to each other.

Polyamides have been rendered sensitive to light heretofore by incorporation therein of sensitizing adjuncts. For example, it has been proposed to treat the synthetic linear polyamides with an ionizable salt, such as ammonium dichromate. In copending application Serial No. 419,076, filed March 26, 1954, photosensitive polyamide compositions are described containing unsaturated compounds having at least two $CH_2=C<$ groupings. Such compositions are used as printing plates or as coatings for printing plates in which portions are selectively insolubilized upon exposure to radiant energy.

The photosensitive portions of the polyamide resins of the invention, in contrast to the prior procedures for imparting photosensitivity, are incorporated directly in the molecule by employing as a reactant in the preparation of the polyamide resin a stilbene compound such as

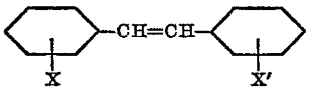

and

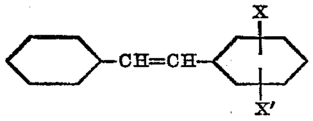

where X and X' are selected from the group consisting of carboxylic acid —COOH, carboxylic ester —COOR and aminomethyl —$CH_2NH_2$ groups. The above includes the stilbene dicarboxylic acids or lower alkyl esters thereof, such as the diethyl and dimethyl esters of 4,4'-stilbene and 2,4-stilbene dicarboxylic acids, aminomethyl carboxylic acids of stilbene, such as 4-aminomethyl-4'-stilbene monocarboxylic acid, and di(aminomethyl) stilbenes such as 3,4'-, 2,4- and 4,4'-di(aminomethyl) stilbene.

While any cis or transposition isomer of stilbene having two carboxylic acid groups or one carboxylic acid group and one aminomethyl group or two aminomethyl groups in the same or different rings can be used, it is preferred that these reactive groups be in the 4,4'-positions of the stilbene. Satisfactory polymers have been obtained with 3,4'; 4,3'; 3,5'; and 3,3' isomers, in which the aminomethyl and carboxylic acid groups are in either position. The 2-series of isomers can be used, but they are the least satisfactory of the group. The 2,3'; 3,2'; 2,4'; 3,6; 2,4; 2,5; and 4,2' isomers are useful, but not as satisfactory as the 4,3'; 3,5'; 3,4'; 3,3' and 4,4' isomers.

The following stilbene compounds are illustrative as starting materials for the production of polyamide resins of the invention having stilbene units in the molecule:

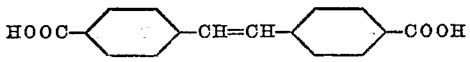

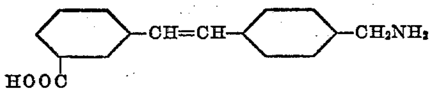

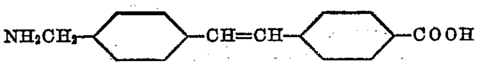

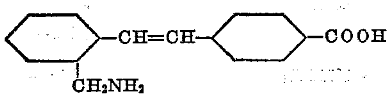

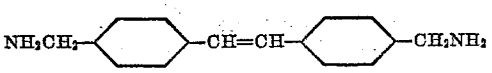

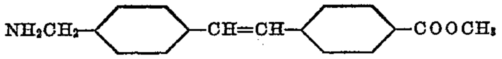

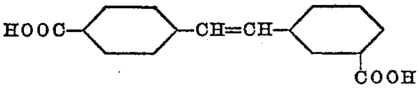

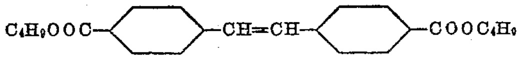

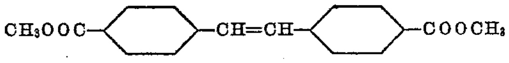

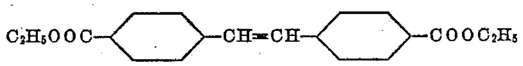

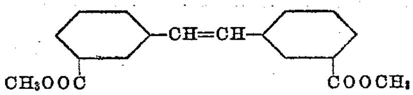

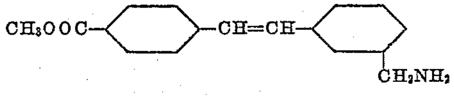

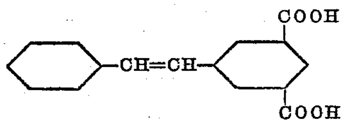

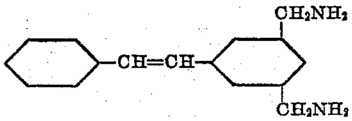

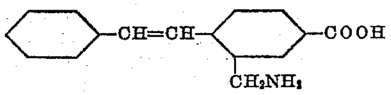

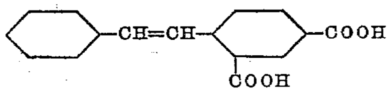

One or both of the benzene radicals of the stilbene unit can, if desired, bear one or more inert substituents, e.g., alkyl radicals, such as, for example, one or more methyl, ethyl, propyl and butyl radicals, halogen, such as chlorine and bromine, and nitro radicals.

The photosensitive polyamide resins of the invention are prepared in accordance with the conventional procedures. The reactants other than the stilbene compound will be bifunctionally reactive therewith to form amide groups in a linear chain and, depending upon whether the stilbene compound contains carboxylic and/or aminomethyl groups, will contain amino and carboxylic acid or ester groups. The aliphatic, cycloaliphatic and aromatic dialkylene amines, dibasic carboxylic acids and esters, and amino carboxylic acids and esters can be used, giving rise to interpolymers of familiar types with the stilbene units in the polyamide chain.

It is preferable to employ diamines, dibasic acids and esters, and aminoacids and esters having unit lengths of from four to twelve. A unit length is the effective length of the chain of the compound, e.g., the sum of the number of amino $NH_2$, methylene $CH_2$ and carbonyl CO units in the compound. Such compounds will have from two to ten $CH_2$ groups, or one or two aryl or cycloaliphatic groups, linking the functional carboxylic acid or ester and amino groups. However, it will be understood that compounds having from one to twenty units can be employed.

As exemplary of the aliphatic, cycloaliphatic and aromatic dialkylene amines which can be used, there are mentioned ethylene diamine, 1,2- and 1,3-propylene diamine, 1,2-, 1,3-, and 1,4-butylene diamine, 1,5- and 1,4-pentamethylene diamine, 1,6-hexamethylene diamine, 1,10-decamethylene diamine, 1,13-tridecamethylene diamine, 1,18-octadecamethylene diamine, 1,3-xylylene diamine, 1,4-xylylene diamine and 1,4-cyclohexylene diamine. As the dicarboxylic acid or ester there can be used malonic acid, methyl malonic acid, succinic acid, glutaric acid, adipic acid, pimelic acid, suberic acid, azelaic acid, sebacic acid, brassylic acid, tetradecanedioic acid, octadecanedioic acid, phenylene diacetic acid, hexahydroterephthalic acid, cyclopentamethylene dicarboxylic acid, and the lower alkyl esters thereof, the alkyl having one to five carbon atoms.

The diamines and dicarboxylic acids are conveniently used as their salts, since this assures the presence of stoichiometrically equivalent quantities, and these salts are available, e.g., hexamethylene diammonium adipate and hexamethylene diammonium sebacate.

The amino carboxylic acids can be in the form of their lactams. The aminocarboxylic acids and esters within the invention correspond in their chain length and structure to the dicarboxylic acids and esters and diamines, but as functional groups have only one amino radical and one carboxylic acid radical in each molecule. Of these compounds, caprolactam, ω-aminocaproic acid, is most widely used and is preferred. However, ω-aminobutyric acid, ω-aminoheptoic acid, ω-aminopelargonic acid, ω-aminoundecanoic acid, ω-aminocaprylic acid, ω-aminopalmitic acid, ω-aminostearic acid and ω-aminolauric acid also are exemplary of this group.

In general, but not necessarily, in the formation of polymers with the stilbene dicarboxylic acids and esters, there would be used a diamine, and if an interpolymer third component is desired, another diamine, diacid, or an aminomonocarboxylic acid or ester can be added. With aminostilbene monocarboxylic acid there would be used both a dicarboxylic acid or ester and a diamine. With diaminostilbene a dicarboxylic acid or ester would be used, and another diamine, diacid, or aminocarboxylic acid or ester would be added to form a three-component interpolymer.

The preparation of polyamide polymers in accordance with the invention follows conventional procedures, as fully set forth in the art. Reference is made to U.S. Patents Nos. 2,071,250 and 2,071,253, dated February 16, 1937, to Carothers, 2,130,523, dated September 20, 1938, to Carothers, 2,320,088, dated May 25, 1943, to Leekley, 2,430,860, dated November 18, 1947, and 2,441,057, dated May 4, 1948, to Cairns, and J. Polymer Sci. 2,306–313 and 412–419 (1947), and 3,85–95 (1948). Generally speaking, the reactants are mixed together under pressure and under a nitrogen atmosphere in stoichiometrically equivalent quantities to give the polymers having the desired proportions of the units of each reactant, and the reaction conducted at an elevated temperature in the range from 200 to 300° C. until a solid polymer is obtained, usually within 2 to 6 hours. In the case of interpolymers containing diamines, and dibasic acids and aminocarboxylic acids or esters, the weight ratios will, of course, be dependent upon the number of mols required for complete reaction. In the case of interpolymers containing three components, e.g., two or more diamines, dibasic acids or esters and aminoacids or esters, the weight ratio of the diamine-dibasic acid mixture to aminoacid may vary from 1:9 to 9:1, the diamine and the dibasic acid being used in substantially equimolecular amounts; preferably the weight ratios will be between 3:7 and 7:3.

The polymers of the invention to afford optimum light sensitivity should contain a weight ratio of stilbene compound to the other reactants within the range of 1:99 to 25:75, preferably from 5:95 to 15:85.

Of the interpolyamides, a particularly valuable polymer is that obtained by the interpolymerization of hexamethylene diammonium adipate, hexamethylene diamine, 4,4′-stilbene dicarboxylic acid or ester, and ε-caprolactam or ω-aminocaproic acid.

There may be incorporated in the photosensitive polyamides of the invention, as an optical ingredient, a minor amount of an unsaturated compound which will appreciably increase the reactivity of the polyamide in the presence of light. Such unsaturated compounds in order to be operative must contain at least one $CH_2=C<$ grouping. Acryl groups are more reactive than allkyl groups. The compound should have a boiling point of at least 100° C., and preferably boils at least at as high a temperature as does N-allylacrylamide in order not to evaporate excessively under the conditions of the process.

Unsaturated compounds which meet this description and which have been found suitable in the practice of the invention are, for example, N-allylacrylamide, hexahydro-1,3,5-triacryl-S-triazine, hexahydro-1,3,5-trimethacryl-S-triazine, ethylene glycol bisallylmaleate, diallylmaleate, N,N-diallylacrylamide, ethylene diacrylate, and triallylcyanurate.

A preferred class of unsaturated compounds have the structure:

$$CH_2=\underset{\displaystyle R}{\underset{|}{C}}-CONH-X-NHCO-\underset{\displaystyle R'}{\underset{|}{C}}=CH_2$$

in which X is a straight or branched alkylene chain having a total of from one to ten carbon atoms, preferably from one to six carbon atoms, and having not more than six carbon atoms in a straight chain connecting the nitrogen atoms of the amido groups, the remaining carbon atoms in excess of six, if any, being present as alkyl radicals attached to the said chain, and R and R′ are selected from the group consisting of hydrogen and lower alkyl groups having from one to five carbon atoms. Preferably, R and R′ are hydrogen, and next preferably, methyl. N,N′-methylenebisacrylamide, N,N′-methylenebismethacrylamide, N,N′-hexamethylenebismethacrylamide, N,N′-hexamethylenebisacrylamide, N,N′-pentamethylenebisacrylamide, N,N′-trimethylenebisbutylacrylamide, N,N′-dimethylenebisamylacrylamide, N,N′-tetramethylenepropylacrylamide, and N,N′-neopentylenebisacrylamide are illustrative.

Another preferred group of unsaturated compounds have the structure:

$$CH_2=\underset{\displaystyle R}{\underset{|}{C}}-CONH-X-CONH-CH_2CH=CH_2$$

where X is a straight or branched alkylene chain having a total of from one to ten carbon atoms, preferably from one to six carbon atoms, and having not more than six carbon atoms in a straight chain connecting the nitrogen of the first amido group, and the carbon of the second amido group, the remaining carbon atoms in excess of six, if any, being present as alkyl radicals attached to the said chain, and R is selected from the group consisting of hydrogen and lower alkyl groups having from one to five carbon atoms. Preferably, R is hydrogen, and next preferably, methyl. 5-acrylylamino-N-allylcaproamide, acrylylamino-N-allylacetamide, and 2-acrylylamino-N,N′-diallylglutaramide are illustrative.

Experience indicates that as the molecular weight increases, photosensitivity and reactivity decrease, so that compounds of lower molecular weight would be used generally in preference to compounds of higher molecular weight. Such compounds are capable of forming cross linkages with polyamide resins, and it is suggested that the effectiveness of these compounds in the invention is due to the formation of such cross links. However, this is merely a hypothesis. Whether cross links are formed is not known.

The relative proportions of the stilbene polyamide and the unsaturated compound, if present, may be varied as desired or as conditions may require. When the unsaturated compound is used, enough is present to give an effect. Therefore, ordinarily, the proportions thereof in the mixture will be within the range of from about 99 to about 75%, preferably 85 to 95%, of the former, to about 1 to about 25% of the latter, by weight, preferably about 5 to 15%.

One method of preparing the mixture of stilbene polyamide and unsaturated compound comprises forming a solution of these two materials in an organic solvent, e.g., a lower alkanol, such as methanol or ethanol. This can be used as a coating composition by applying the solution to a base material in the form of a film and evaporating the solvent. Self-supporting films can be prepared by using a base from which the film is stripped. The mixture may also be prepared in the form of a salt, and the melt may be extruded, injection molded or compression molded in the form of sheets or plates.

When the stilbene polyamide composition of the invention contains an unsaturated compound, from 0.001 to 1% by weight of the composition of a polymerization inhibitor can be included in the composition. The inhibitor should be substantially heat-stable at polyamide molding temperatures. The preferred inhibitors constitute as a class aromatic compounds having a structure selected from the group consisting of:

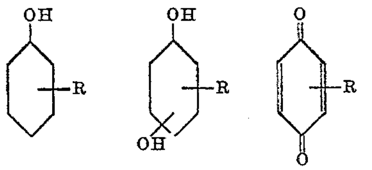

and

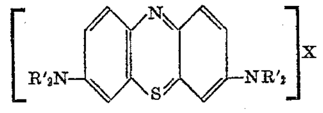

where R is hydrogen, alkyl and alkoxy having from one to five carbon atoms, or aryl alkoxy having from six to eleven carbon atoms, R′ is hydrogen or alkyl having from one to five carbon atoms, and X is a salt-forming anion, such as halogen, i.e., chloride or bromide, sulfate, or nitrate. These classes of compounds introduce an induction period or delay in the photopolymerization of the photosensitive components in the polyamide resin composition, whether these components are incorporated as light-sensitive units directly in the polyamide molecule or as photopolymerizable compounds incorporated as adjuncts to the composition. This period of delay may be quite short or even infinitesimal in strongly illuminated areas, but it is helpful in the nonilluminated areas to prevent polymerization due to scattered light entering such areas. As examples of such preferred polymerization inhibitors, there can be mentioned pyrogallol, quinone, hydroquinone, methylene blue, t-butyl catechol, hydroquinone monobenzyl ether, methyl hydroquinone, amyl quinone, amyloxy hydroquinone, n-butyl phenol, phenol, and hydroquinone monopropyl ether. These inhibitors or stabilizers are well known.

During exposure, the amounts indicated delay and thus prevent photopolymerization due to scattered light in the nonexposed areas of the composition, but do not greatly interfere with or delay the photopolymerization of the composition in strongly exposed areas, thus aiding in formation of a plate of optimum depth and surface configuration.

Photopolymerization of the stilbene polyamide, and of the unsaturated compound, if present, can be effected by simply subjecting the mixture of the two components to a source of radiant energy, either light or a combination of heat and light. A photoinitiator is not required usually, since the stilbene polyamides are quite light-sensitive. However, should the stilbene polyamide's and/or the unsaturated compound's light sensitivity be insufficient, it is possible to incorporate therein a catalytic amount of a light-sensitive photopolymerization initiator.

Photoinitiators or catalysts which are known to promote analogous polymerization reactions under the influence of light can be used. Among the photoinitiators known to be primarily sensitive to light, several of those which have the nucelus,

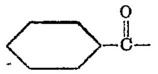

in which the phenyl group may bear substituents such as hydroxyl or carboxyl radicals, have been found especially suitable. Representative light-sensitive photoinitiators, many of which have this nucleus, and which are suitable, are benzil, benzoin, benzaldehyde, benzoin acetate, benzilic acid, acetophenone, and similar compounds. Other keto compounds such as butanedione may also be used, as well as benzoyl peroxide.

Particularly desirable are the benzophenones and the substituted benzophenones having the following formula:

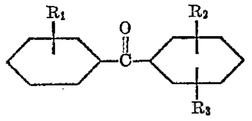

where $R_1$, $R_2$ and $R_3$ are selected from the group consisting of hydrogen; halogen; hydroxyl; carboxylic COOH; carboxylic salts COOM, where M is a metal cation, e.g. an alkali metal; carboxylic ester COOR, where R is alkyl of one to five carbon atoms; alkyl of one to five carbon atoms, e.g. $CH_3$; amino $NH_2$ or substituted amino $NR_4R_5$ where $R_4$ and $R_5$ are alkyl or hydrogen, the alkyl having one to five carbon atoms; and alkoxy, the alkyl having one to five carbon atoms.

The following are illustrative:

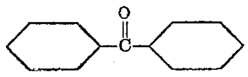

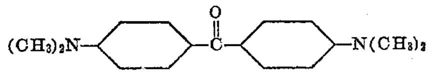

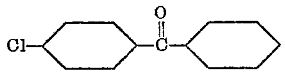

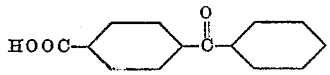

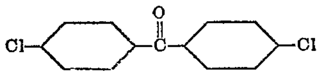

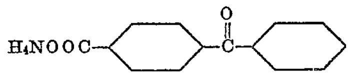

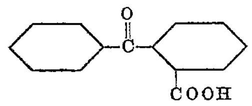

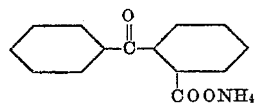

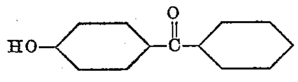

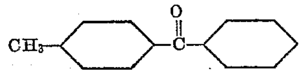

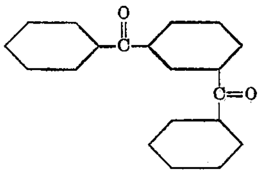

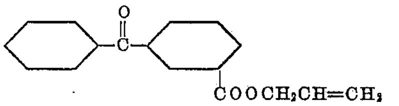

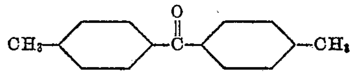

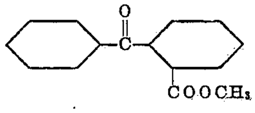

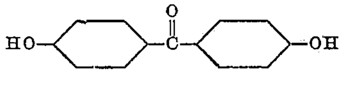

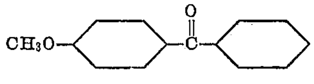

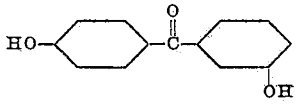

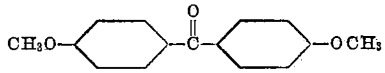

Catalytic activity is diminished by chelating radicals in positions ortho to the carbonyl group. Such radicals include hydroxyl and amino groups. The compounds, therefore, should be free from ortho chelating groups.

When a photoinitiator is employed to accelerate the reaction, the concentration is usually small and preferably ranges from about 0.01% to about 10% photoinitiator by weight of the composition. Usually 1 to 5% would be used. The amount will depend upon the amount of absorption desired. Since the light-sensitive photoinitiator absorbs light, it affects the penetration of light into the composition. Therefore, the amounts of photoinitiator must be chosen to give an adequate rate of photopolymerization at the surface and at the same time permit sufficient light to penetrate far enough to prevent any undercutting of the image during development. A reasonably high concentration of the photoinitiator is also effective in absorbing the small amount of light which is scattered laterally within the composition into the nonimage areas at greater than the angle desired to increase shoulder size. This scattered light is thus prevented from effecting undesired polymerization in the nonimage areas.

The photoreaction is preferably effected by exposing the mixture to a source of light. Ultraviolet light is generally more effective than ordinary light. The time required for a light-promoted reaction will vary considerably depending upon the amount of photoinitiator used, the reactivity of the mixture, the depth of plate desired, and the conditions of reaction, but, under ordinary conditions, from one to thirty minutes, in rare instances up to several hours, will be required.

The depth of plate in a half-tone area decreases as the amount of photopolymerization in the nonimage areas increases. Therefore, plates get shallower with greater exposure. The depth to which a line or type image can be developed without undercutting increases with exposure, because the depth to which the image area is photopolymerized increases with exposure.

It is important that the final photosensitive composition be translucent so as to permit the passage of light in sufficient quantity to effect the polymerization to the desired depth. A very high degree of translucency is not required, since polymerization need not extend all the way through the plate. A turbidity of from about 0.01 to about 0.5 $mil^{-1}$ is satisfactory. This is determined as follows:

The light transmission T of a sample to a depth $t$ below the surface can be related to its turbidity in $mils^{-1}$ by the following expression:

$$T=(1-R)10^{-(kc+\gamma)t}$$

or $$kc+\gamma=\frac{\log (1-R)-\log T}{t}$$

where $\gamma$=turbidity of film
$T$=transmission
$R$=reflection coefficient at surface
$k$=absorption coefficient
$c$=concentration of photoinitiator
$t$=depth in mils If it is assumed to be desirable that at least 10% of the light be transmitted to 2 to 5 mils below the surface, then $kc+\gamma$ must be in the range of 0.5 to 0.2. If absorption is negligible, then $kc$ is equal to 0 and this fixes the upper limit of $\gamma$ at 0.5 $mil^{-1}$. On the other hand, if the absorption is appreciable, then $\gamma$ may be very small. Assuming that 5 to 10% of the attenuation of the primary beam is due to scattering to build up the base on the dot, the lower limit of $\gamma$ falls at approximately 0.01 to 0.02 $mil^{-1}$.

If benzophenone is assumed to be the only absorber present, and $c$ is expressed in percent and $t$ in mils, then $k$ is equal to $7\times10^{-3}$. This value was arrived at using a value of log $E$=1.7 for benzophenone at 365 m$\mu$.

The reflection coefficient R can be calculated from Fresnel's law, which for normal incidence reduces to $$R=\frac{(n-1)^2}{(n+1)^2}$$

In this expression, $n$ is the refractive index. A value of $n$=1.5 is quite reasonable for a polyamide plate composition of the invention. This is based upon the fact that polyhexamethylene adipamide and polycaprolactam have a refractive index of approximately 1.53. The benzophenone is approximately 1.55 and the unsaturated compound can be expected to be of the order of 1.5. In practice, values of $n$ between 1.4 and 1.6 have very little effect upon the calculated value for $\gamma$.

The invention is valuable in forming printing plates and films made wholly of the photosensitive composition. These embodiments are photosensitive throughout. The present process also makes possible the formation of coated printing plates on any base by the deposition by any known process of films or coatings of the photosensitive polyamide composition thereon. Typical bases are metal sheets, sheets made of synthetic resins and cellulose derivatives, fabrics, paper, and leather. The plates formed wholly of or coated with the photosensitive polyamide composition are useful in photography, photomechanical reproductions, lithography, and intaglio printing. More specific examples of such uses are offset printing, silk-screen printing, duplicating pads, manifold stencil sheeting coatings, lithographic plates, relief plates, and gravure plates. The term "printing plate" as used in the specification and claims is inclusive of all of these.

A preferred method of preparing gravure plates using the photosensitive polyamide compositions of the invention is described and claimed in copending application Serial No. 654,300 of Robert M. Leekley, Robert L. Sorensen and Donald J. Byers filed on even date herewith. A preferred method of preparing relief printing plates is described and claimed in copending application Serial No. 654,150 of Robert M. Leekley filed on even date herewith.

A specific application of the invention is illustrated by a typical preparation of a printing plate. In this application, a plate, usually of metal or a resilient sheet material, is formed wholly of, or coated with a film of, the photosensitive stilbene polyamide or mixture thereof with a photosensitive copolymerizable monomeric compound, and the surface of the plate is then exposed to light through a contacted negative image composed of transparent and opaque areas on film or glass. The light induces the photopolymerization reaction which insolubilizes the areas of the surface beneath the transparent portions of the image, while the areas beneath the opaque portions of the image, being shielded from light, remain soluble.

The soluble areas of the surface are removed by a developer to sufficient depth that the insoluble raised portions which remain can be used as a relief printing plate. However, it is possible to use the composition in other manners. A thin film can be used to form a resist image on a metal or other support. After development, the base material can be etched with chemical etching agents such as acid or ferric chloride or by an abrasive blast to form a relief image in the base material. Similarly, a bimetal offset plate can be prepared using the composition as a resist stencil. Another type of offset plate can be prepared by coating the composition on a suitable hydrophilic support. The nylon image obtained by development will carry the ink and the wet support will resist ink.

In exposing the photosensitive polyamide compositions it is desirable that some light strike the plate at a high angle of incidence. This is conveniently accomplished by using a large light source such as a bank of tubular lights or by causing the plate to move past a tubular light source. The optimum amount of oblique light will be dependent on the light scattering characteristics of the photosensitive polyamide and can be controlled if necessary with baffles.

Whenever oblique light is used for exposure, excellent contact between the negative and the photosensitive plate is essential if broadening of the image elements is to be avoided. The emulsion side of the negative should be placed in direct contact with the plate without any spacing layer. However, a spacer can be used if it is desired to broaden the image elements. It is highly desirable to use a vacuum frame to hold the negative and plate in intimate contact.

In order to further illustrate the invention, the following examples are given, which in the opinion of the inventors represent the best embodiments of their invention.

*Example 1*

This example illustrates the preparation of a methanol-insoluble stilbene polyamide from dimethyl-4,4′-stilbene dicarboxylate, 1,6-hexamethylene diamine and ε-caprolactam. The dimethyl-4,4′-stilbene dicarboxylate was prepared from α,β-diphenylethane, according to the following procedure:

A solution of α,β-diphenylethane (25 g.) in glacial acetic acid (275 ml.) and water (13.3 ml.) containing 110 g. bromine was refluxed until separation of the 4,4′-α,β-tetrabromo-α,β-diphenylethane and its 2,4′-isomer had ceased.

This required approximately 1 hour. The reaction mixture was filtered hot through a fritted glass Buchner funnel, and the material on the filter washed with glacial acetic acid, and then with ether. The crude product was boiled in glacial acetic acid, filtered, and washed with boiling glacial acetic acid. It was then slurried with ether, filtered and washed with ether.

The 4,4′-α,β-tetrabromo-α,β-diphenylethane (24.5 g.) was mixed with cuprous cyanide (27.3 g.) and pyridine (27.5 ml.) and heated at 200 to 210° C. for 1½ hours. 58.5 ml. of pyridine was then added, the whole boiled 5 minutes longer, and poured hot into 146 ml. of concentrated hydrochloric acid. The solid material, 4,4′-dicyanostilbene, was filtered off hot, washed with 50 ml. of hot concentrated hydrochloric acid and then with water, and dried overnight at 90° C. The crude product was recrystallized from nitrobenzene, and the moist cake then dissolved in 300 ml. of boiling nitrobenzene. The solution was cooled quickly, and 19 ml. of methanol added. The mixture was saturated with hydrogen chloride gas, and allowed to stand at room temperature for 40 hours. The yellowish brown crystalline solid, the iminoether hydrochloride of 4,4′-dicyanostilbene, was filtered on a fritted glass Buchner funnel and washed with anhydrous ether.

The product (7 g.) was suspended in 22 ml. of water and heated on the steam bath for 2 hours. The product was filtered and recrystallized from 300 ml. of methanol by Soxlet extraction overnight, thereby producing the dimethyl ester of 4,4′-stilbene dicarboxylic acid. The filtrate was returned to the extractor, and extraction continued for 6 hours. On cooling, the solution produced shining plates of the compound, melting point 320° C.

In a reaction vessel was placed 0.147 part of the dimethyl 4,4′-stilbene dicarboxylate, 0.058 part 1,6-hexamethylene diamine, 2.5 parts ε-caprolactam, and sufficient water to make up 8.5 volumes. The reaction was carried out under nitrogen at 250 to 260° C. A pressure of 200 to 300 p.s.i. was maintained for the first 2 hours. Thereafter, pressure was reduced to atmospheric during the next hour by slow distillation of water, and then slowly reduced to 2 mm/Hg during the next hour. For one additional hour, reaction was continued at 250 to 260° C. at a pressure of 2 mm/Hg. The reaction vessel was then allowed to cool under vacuum. The polymer was light-colored and tough, and produced fibers with good cold-drawing properties.

A portion of the polymer was molded into a flat disc in a metallurgical hydraulic press, during which operation the polymer remained light colored. The disc was exposed for one hour at 3 feet from a carbon arc light, beneath a negative, and then developed for 15 minutes in a developer solution containing 90 g. of calcium chloride dissolved in 1000 ml. of methanol. During the development, a definite relief image, corresponding to the design on the negative, was formed. The etch depth was somewhat shallow, but the design was raised, thus demonstrating that during the exposure to light, those portions of the disc which were reached by the light were rendered insoluble in the developer. The disc could be printed just as a conventional letterpress printing plate.

*Example 2*

This example illustrates the preparation of a methanol-soluble stilbene polyamide in accordance with the invention.

2.37 parts caprolactam, 1.75 parts 1,6-hexamethylenediammonium adipate, 0.151 part 1,6-hexamethylene diamine, 0.42 part diethyl-4,4′-stilbene dicarboxylate (prepared by the procedure of Example 1, recrystallizing the iminoether hydrochloride of dicyanostilbene from ethanol in lieu of methanol) and 4.3 parts by volume of water were charged into a reaction vessel, and reacted in an atmosphere of nitrogen at 250 to 260° C., exactly as set forth in Example 1. The polymer was light-colored, tough, readily cold-drawn, and methanol-soluble.

When formed in a thin molded disc, and exposed for 1 hour through a negative at 3 feet from a carbon arc light, portions of the sheet reached by the light passing through the negative were rendered insoluble in the developer. The disc was developed for 15 minutes in a developer solution containing 90 g. of calcium chloride dissolved in 1000 ml. of methanol, and a definite relief image was formed, corresponding to the design on the negative. The disc could be printed as a letterpress printing plate.

In order to demonstrate that the light-absorption of the polymers in Examples 1 and 2 was caused by a stilbene group constituting an integral unit in the polyamide molecule, a portion of each of the polymers was thoroughly extracted with benzene. There was no measurable difference in absorption as a result of the extraction, showing that the benzene treatment did not remove any stilbene dicarboxylic ester. Since the ester is quite soluble in benzene, this shows that no free ester was present.

*Example 3*

The following materials were charged into a glass-lined stainless steel autoclave:

Dimethyl 4,4′-stilbene dicarboxylate, 100 parts
1,6-hexamethylene diamine, 39.1 parts
ε-caprolactam, 1700 parts
Water, 4300 parts The air in the autoclave was replaced by nitrogen, and the autoclave was heated at 250–260° C. After two hours, during which the pressure rose to 300 pounds per square inch, the pressure was gradually reduced to atmospheric pressure during the next hour by slowly venting the gases. During the next hour, the pressure was slowly reduced to 2 mm/Hg, and then the pressure was maintained at 2 mm/Hg for the final hour. At the end of the heating cycle the autoclave was cooled under vacuum. The product was a light-colored, tough stilbene polyamide, which produced fibers with good cold-drawing properties.

The methanol-insoluble stilbene polyamide was molded into a flat sheet in a hydraulic press. When this sheet was exposed to a carbon arc light through a negative, and then developed for 15 minutes in a solution of 90 g. of calcium chloride dissolved in 100 ml. of methyl alcohol, a definite relief image was formed. The sheet was a true letterpress printing plate.

*Example 4*

The following materials were charged into a glass-lined stainless steel autoclave:

Diethyl 4,4′-stilbene dicarboxylate, 100 parts
1,6-hexamethylene diamine, 35.8 parts
1,6-hexamethylene diammonium adipate, 416 parts
ε-Caprolactam, 564 parts
Water, 2020 parts These materials were polymerized by heating as described in Example 3. The product was a light-colored, tough, methanol-soluble stilbene polyamide which could be readily cold-drawn. 15 parts of the stilbene polyamide were dissolved in 85 parts of methanol, and the solution was cast on glass. When a film about 0.0015″ in thickness was exposed for 4 hours to a mercury vapor lamp, the film became insoluble in boiling methanol.

The following examples illustrate the preparation of alcohol-soluble stilbene polyamide compositions in accordance with the invention containing additional photosensitive unsaturated compounds to intensify the effect of light upon the photopolymerization of the resin.

*Example 5*

9.7 parts of N,N′-methylenebisacrylamide was dissolved in a small quantity of anhydrous ether. This solution was then poured over 90 parts of the stilbene polyamide of Example 3, and mixed until the mass was dry. The powder was then placed in a molding cavity and under a pressure of 10,000 lbs. and a temperature of 135° C. was formed into a molded disc. This mold was then slowly cooled and disc removed from the mold at room temperature. The stilbene polyamide disc was then photoprinted using a type negative and a carbon arc exposure of 30 minutes. These were then developed in a splash machine using a developer with a specific gravity of 0.95 formed by dissolving anhydrous calcium chloride in ethanol. A relief printing plate having type images was obtained, suitable for letterpress printing.

*Example 6*

To 150 parts of anhydrous methanol was added 90 parts of the stilbene polyamide of Example 4, 10 parts of N,N′-methylenebisacrylamide and 0.01 part of methylene blue.

Upon heating and stirring, a complete solution was formed. A photosensitive film was formed by casting the solution on a glass plate and drying overnight. The film was then cut into small pieces, placed in a molding cavity and a molded plate was formed using a pressure of 10,000 lbs. and a temperature of 135° C. After the mold was cooled to room temperature, the photosensitive stilbene polyamide plate was removed from the cavity. The plate was photoprinted through a negative type image using a carbon arc exposure of 30 minutes. It was developed for 20 minutes at 110° F. using a developer with a specific gravity of 0.95 formed by dissolving anhydrous calcium chloride in anhydrous methanol.

A letterpress printing plate containing type images 0.040 inch deep was then obtained.

*Example 7*

A solution of the following materials was made: 72 parts of methanol, 90 parts of the stilbene polyamide of Example 4, 7 parts of N,N′-methylenebismethacrylamide, and 0.07 part of methylene blue.

The solution was cast and air-dried 24 hours to produce a dry film. This was cut to small chips, placed into the hot molding cavity at a temperature of 440° F., and under a pressure of 6,000 lbs. was formed into a solid stilbene polyamide plate. Using a negative type image, the plate was exposed to a carbon arc for one hour, then developed in the splash etching machine at 100° F. for 15 minutes using the developer composed of 90 g. of anhydrous calcium chloride in 1 liter of methanol. The developed printing plate had relief images of letterpress type.

*Example 8*

Ten parts of 5-acrylylamino-N-allylcaproamide and 0.07 part of methylene blue were dissolved in 130 parts of absolute methyl alcohol. This solution was made into a slurry with 100 parts of the stilbene polyamide of Example 3. The alcohol was allowed to evaporate to dryness, and the residue dried over anhydrous calcium chloride for about 40 hours. The resulting powder was molded into a plaque at about 210° C. under a pressure of 5,000 p.s.i. The plaque was quench-cooled. Exposure through a type negative in a vacuum frame was made for 15 minutes to a water-jacketed UA11 lamp at 4 inches, then splash developed for 15 minutes at 25° C. in a solution of absolute methyl alcohol containing 200 grams of anhydrous calcium chloride per liter of methanol. The resulting printing plate showed relief areas corresponding to the transparent areas of the type negative, and was useful as a letterpress printing plate.

*Example 9*

There was prepared a solution in ethanol containing 1.5 parts stilbene polyamide prepared in accordance with Example 4, 0.4 part of triallylcyanurate and 0.47 part of benzophenone. A glass plate was placed on a hot plate at 35° C. using a draw-down applicator with 0.024 inch clearance. Two films were cast, one on top of the other, on a glass sheet, allowing one hour between applications. The composition film was then allowed to dry until tack free.

The coated glass plate was divided into two pieces and one piece exposed under vacuum for 30 minutes at a distance of 4 feet from a carbon arc. Both the exposed and unexposed portions of the glass plate were then oven-dried at 60° C., weighed and immersed in boiling methanol for 4 minutes. The unexposed portion of the film quickly dissolved. The exposed portion underwent a weight loss of only about 60 percent.

The term "polyamide" as used in the specification and in the claims means polymers of aminocarboxylic acids, polymers of dicarboxylic acids and diamines, and interpolymers of both these types of polymers. Such polyamides are described in U.S. Patents Nos. 2,071,250, 2,071,253, 2,130,523, 2,320,088, 2,430,860 and 2,441,057, and in J. Polymer Science 2, 306–313, 412–419 (1947), and 3, 85–95 (1948).

The terms "soluble," "insoluble," and "photoinsolubilized" as used to characterize the polyamide refer to solubility in the developer.

All parts and percentages in the specification and claims are by weight.

We claim:

1. A process for forming a photoinsolubilized printing plate which comprises exposing to radiant energy selected portions of a developer-soluble photosensitive polyamide which has carbonamide groups as an integral part of the polymer chain and has in the chain of the polyamide molecule light sensitive stilbene units selected from the group consisting of

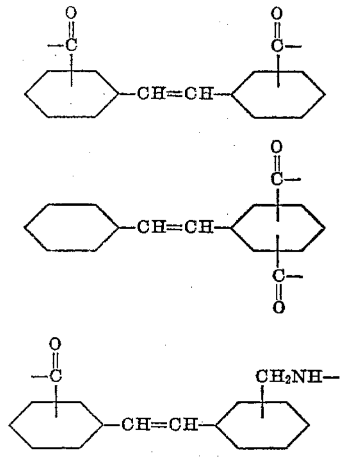

and

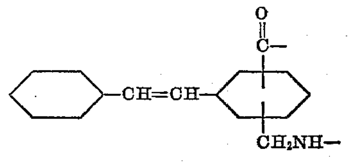

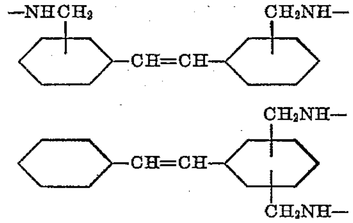

to convert said polyamide to a developer-insoluble form in the exposed portions; and washing away the developer-soluble polyamide in the unexposed portions with a developer solution to form a printing relief.

2. A process for forming a photoinsolubilized printing plate as set forth in claim 1 in which the developer-soluble polyamide resin is coated on a base prior to the exposing step.

3. A process for forming a photoinsolubilized printing plate as set forth in claim 1 in which the developer-soluble polyamide resin contains a small amount of a photoinitiator sensitive to radiant energy.

4. A process for forming a photoinsolubilized printing plate as set forth in claim 1 in which the developer-soluble polyamide resin contains a minor amount of an unsaturated compound having at least one $CH_2=C<$ group.

5. A process for forming a photoinsolubilized printing plate as set forth in claim 1 in which the developer-soluble polyamide resin contains a small amount of a heat-stable photopolymerization inhibitor.

6. A printing relief formed by the process of claim 1.

7. A printing relief formed by the process of claim 2.

References Cited in the file of this patent

UNITED STATES PATENTS

| | | |
|---|---|---|
| 2,309,729 | Gordon | Feb. 2, 1943 |
| 2,500,028 | Griggs et al. | Mar. 7, 1950 |
| 2,657,195 | Toland | Oct. 27, 1953 |
| 2,760,863 | Plambeck | Aug. 28, 1956 |
| 2,794,793 | Coover | June 4, 1957 |
| 2,798,061 | Cooveret et al. | July 2, 1957 |

OTHER REFERENCES

Casanova et al.: German printed appl. T10743 IV a/57d, Dec. 8, 1955 (5 pp. spec., 1 p. dwg.).

UNITED STATES PATENT OFFICE

CERTIFICATE OF CORRECTION

Patent No. 2,997,391 August 22, 1961

Margaret H. Murray et al.

It is hereby certified that error appears in the above numbered patent requiring correction and that the said Letters Patent should read as corrected below.

Column 6, line 5, for "optical" read -- optional --; column 16, line 43, for "Cooveret" read -- Coover --.

Signed and sealed this 2nd day of January 1962.

(SEAL)
Attest:

ERNEST W. SWIDER
Attesting Officer

DAVID L. LADD
Commissioner of Patents